(12) United States Patent
Szu et al.

(10) Patent No.: US 6,508,658 B1
(45) Date of Patent: Jan. 21, 2003

(54) ZIF SOCKET WITH IMPROVED RETENTION MECHANISM

(75) Inventors: Ming-Lun Szu, Tu-Chen (TW); Genn-Sheng Lee, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/027,731

(22) Filed: Dec. 19, 2001

(51) Int. Cl.⁷ ................................................. H01R 4/50
(52) U.S. Cl. ...................................................... 439/342
(58) Field of Search ................. 439/342, 259, 439/266

(56) References Cited

U.S. PATENT DOCUMENTS 6,338,640 B1 * 1/2002 Lin ............................. 439/342
6,406,317 B1 * 6/2002 Li et al. ...................... 439/342
6,419,514 B1 * 7/2002 Yu .............................. 439/342

* cited by examiner

Primary Examiner—Tho D. Ta
Assistant Examiner—Ann McCamey
(74) Attorney, Agent, or Firm—Wei Te Chung

(57) ABSTRACT

A ZIF socket (1) includes a base (10) having a plurality of passageways (100) for receiving a corresponding number of contacts (20) therein, a cover (12) having a corresponding number of holes (125) in alignment with the corresponding passageways, and a lever (14) assembled between the base and the cover for driving the cover to move along the base. The base includes a retention member (163) and the cover includes a supporting surface (1231) and a slot (165) to cooperate with the retention member. Both of the retention member and the supporting surface are disposed for efficiently fastening the cover and the base together.

6 Claims, 10 Drawing Sheets

US 6,508,658 B1

ZIF SOCKET WITH IMPROVED RETENTION MECHANISM

BACKGROUND OF THE INVENTION

1. Field of the Invention

The invention relates to a ZIF (Zero Insertion Force) socket, and particularly to a ZIF socket having a retention means provided for efficiently confirming a cover to move in a restrained horizontal direction relative to a base.

2. Description of Related Art

It is well known that a CPU (Central Processing Unit) package is commonly connected to a mother board through a ZIF (Zero Insertion Force) socket which is mounted on the mother board. The ZIF socket generally includes a base securely mounted on the mother board, and a cover movable relative to the base by means of a lever whereby the CPU package may be loaded onto the socket in a ZIF status when the lever is in a vertical position and the socket is in an open state, and whereby conductive pins of the CPU package can engage corresponding contacts in the socket for signal transmission when the lever is in a horizontal position and the socket is in a closed state.

FIGS. 14 and 15 illustrate a ZIF socket disclosed in U.S. Pat. No. 5,722,848 entitled "Retention mechanism for self-securement of ZIF PGA socket". The socket 3 comprises a retention member 323 formed on the cover 32 and an engaging member 302 projecting from the base 30 and received in a recess 301. The engaging member 302 defines a restriction plane 3021, and the retention member 323 comprises a vertical portion 3231 and a horizontal portion 3232 engaging with the restriction plane 3021. When a handle 341 of a lever 34 of the socket 3 is in a vertical position and therefore the socket is in an open state, only a free end of the horizontal portion 3232 contacts with the restriction plane 3021 of the engaging member 302. Therefore, the horizontal portion 3232 is easy to disengage from the engaging member 302 because an engagement area between the horizontal portion 3232 and the restriction plane 3021 is small when the socket is in the open state. Furthermore, the retention member 323 is subject to a largest resisting force in a vertical direction, so the resisting forces may cause damage to a junction between the retention member 323 and the body of the cover 32. As a result, the cover 32 may disengage from the base 30.

Hence, a ZIF socket having an improved retention mechanism is required to overcome the disadvantages of the conventional ZIF socket.

SUMMARY OF THE INVENTION

The object of the present invention is to provide a ZIF socket having a retention mechanism directly formed on the base and cover for efficiently controlling the cover not to be lifted upward during or after the sliding movement of the cover relative to the base.

A ZIF socket in accordance with the present invention includes a base having a plurality of passageways for receiving a corresponding number of contacts therein, a cover having a corresponding number of holes in alignment with the corresponding passageways, and a lever assembled between the base and the cover. The base includes a retention member and the cover includes a supporting surface and a slot to cooperate with the retention member. Both of the retention member and the supporting surface are disposed on a rear end of the socket for efficiently fastening the cover and the base together.

Other objects, advantages and novel features of the invention will become more apparent from the following detailed description when taken in conjunction with the accompanying drawings.

DETAILED DESCRIPTION OF THE INVENTION

Figure 1:
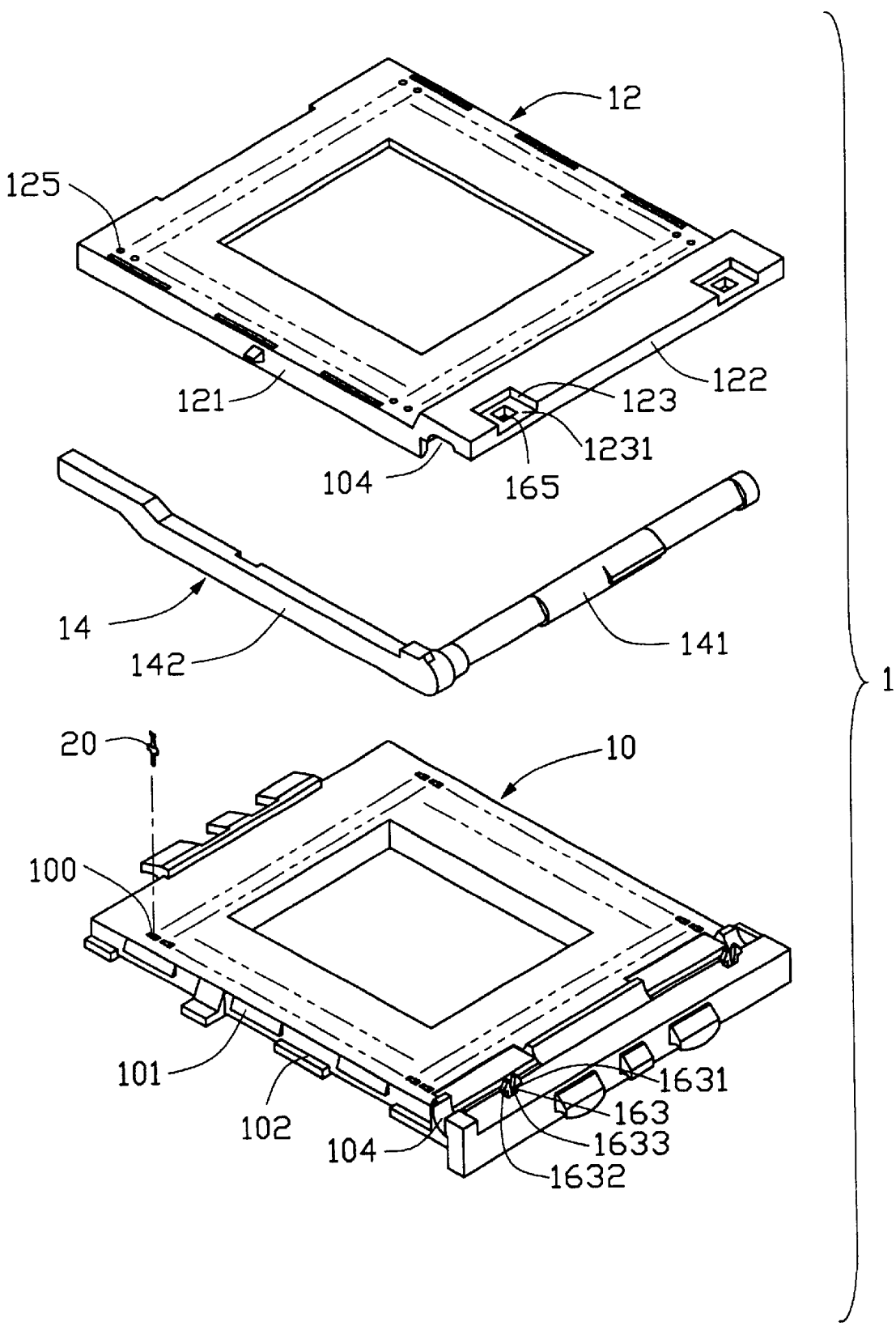
FIG. 1 is an exploded, perspective view of a ZIF socket in accordance with a first embodiment of the present invention.

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is now directed to FIGS. 1–5 which illustrate a ZIF socket 1 in accordance with a first embodiment of the present invention. The ZIF socket 1 includes a base 10 having a plurality of passageways 100 (only few shown) extending vertically therethrough for receiving a corresponding number of contacts 20 therein. A cover 12 having a contour similar to the base 10, includes a plurality of holes 125 (only few shown) extending vertically therethrough in alignment with the corresponding passageways 100, respectively, so that downwardly extending pins of a CPU package (not shown) may project downwardly through the corresponding holes 125 in the cover 12 and further into the corresponding passageways 100 in the base 10 for mechanically and electrically engaging with the corresponding contacts 20 therein. Similar to the existing sockets, the base 10 includes several upper protrusions 101 and several lower protrusions 102 formed on two side outer surfaces thereof, and the cover 12 correspondingly includes several protrusions (not shown) on its two side inner surfaces. The protrusions of the cover 12 cooperate with the upper protrusions 101 of the base 10 to fasten the cover 12 and the base 10 together in a vertical direction, and bottom edges of two side walls 121 of the cover 12 are seated on the lower protrusions 102 of the base 12.

The socket 1 further includes a lever 14 assembled between the base 10 and the cover 12 for actuating the cover 12 to move along the base 10. The lever 14 includes an actuation handle 142 and a cam shaft 141 wherein the handle 142 is positioned exposed beside one side wall 121 of the cover 12, and the cam shaft 141 is received within a channel formed by two half channels 104 respectively defined in the cover 12 and the base 10.

A pair of cutouts 123 is defined in a rear portion 122 of the cover 12 and each has a supporting surface 1231 at the bottom thereof. A slot 165 is defined in the supporting surface 1231 extending through the cover 12.

A pair of retention members 163 integrally extends upwardly from a rear wall of the base 10 for being movably received within such cutouts 123 and the slots 165. The retention member 163 includes vertical aligning section 1631 movably received in the slot 165 and horizontal hook section 1632 extending from upper end of the vertical aligning section 1631. A hole 1633 is defined in the retention member 163 for providing resiliency and a pin may be inserted therein. The hole 1633 divides the vertical aligning section 1631 and the horizontal hook section 1632 into two half portions.

Figure 2:
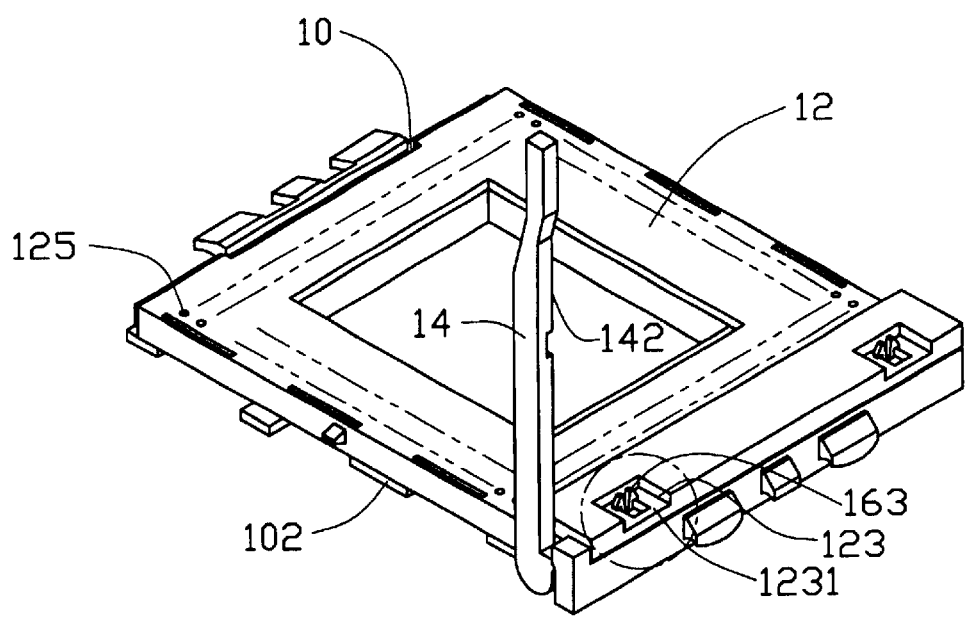
FIG. 2 is an assembled perspective view of the ZIF socket of FIG. 1 wherein the lever is in a vertical position.
Figure 3:
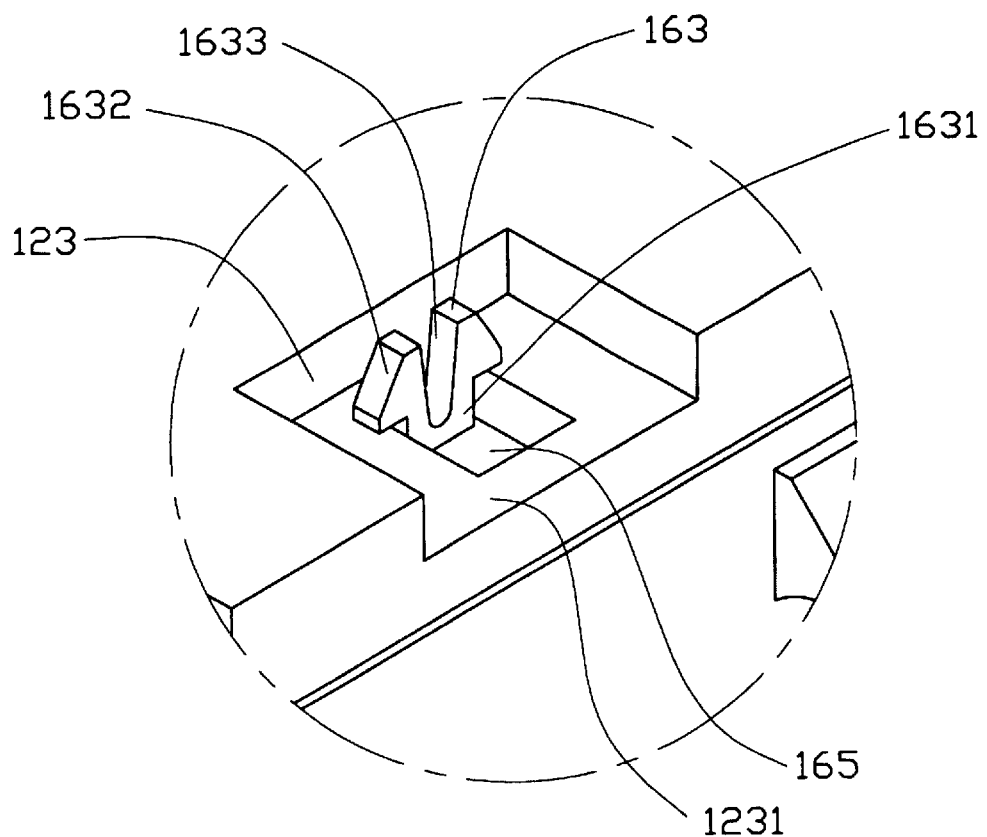
FIG. 3 is an enlarged, partial view of a retention mechanism of the ZIF socket of FIG. 2.

As shown in FIGS. 2 and 3, when the handle 142 of the lever 14 is rotated to its vertical position, the cover 12 is pushed to move to its rearward outermost position by the cam shaft 141 of the lever 14 and the socket 1 may be deemed as being in an open state ready for zero insertion of the CPU package. Under this situation, the vertical aligning section 1631 of the retention member 163 abuts against a front inner side of the slot 165 and the hook section 1632 abuts against the supporting surface 1231 in the cutout 123, thus assuring that the retention member 163 of the base 10 is always disposed in the cutout 123 of the cover 12 without any possibility of withdrawal therefrom by any inadvertent external impact.

Figure 4:
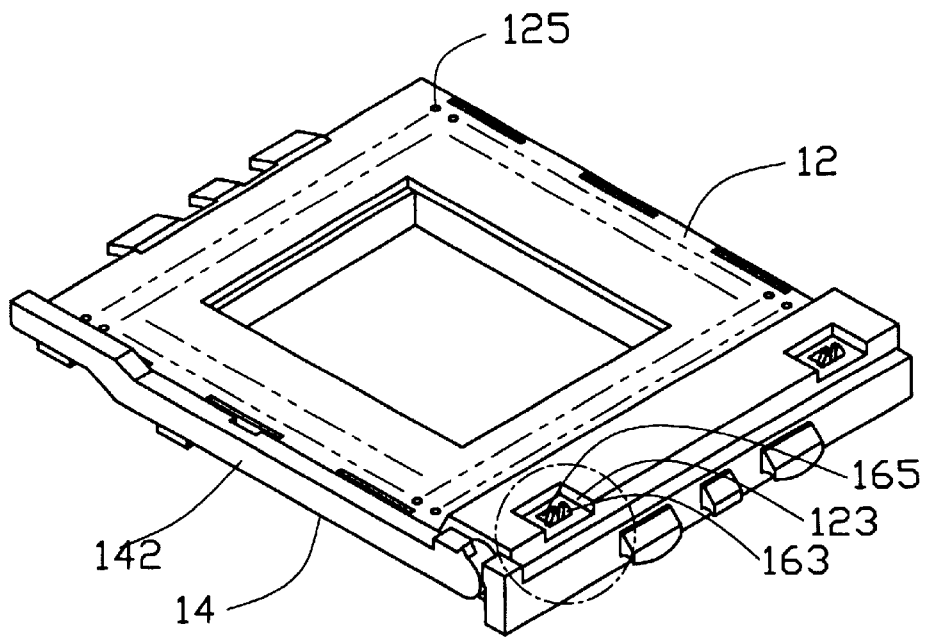
FIG. 4 is a perspective view of the assembled ZIF socket wherein the lever is in a horizontal position.
Figure 5:
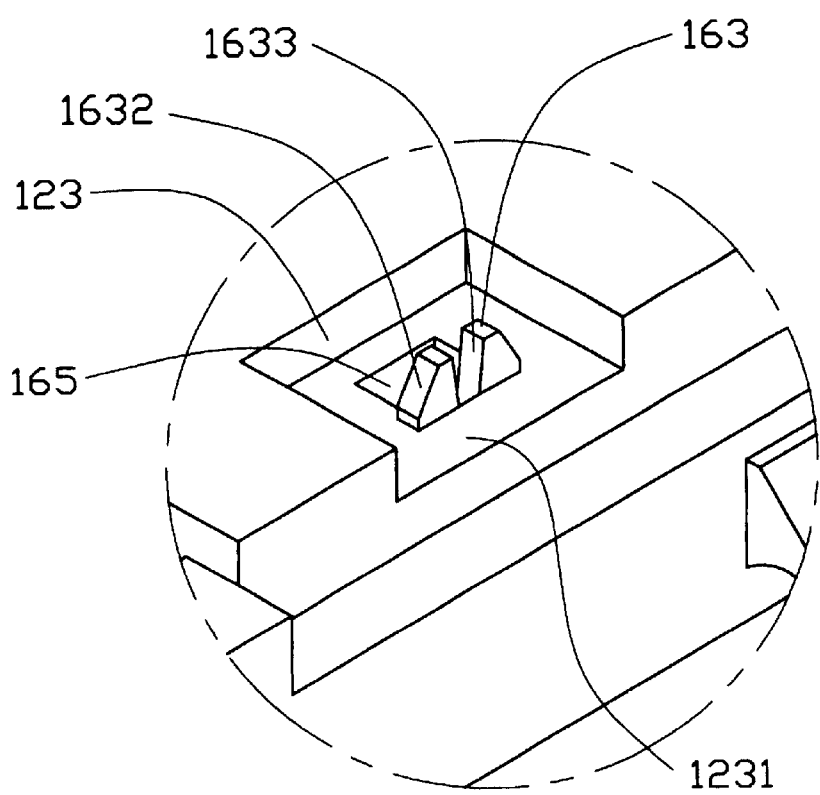
FIG. 5 is an enlarged, partial view of the retention mechanism of the ZIF socket of FIG. 4.

Further referring to FIGS. 4 and 5, when the CPU package is loaded onto the cover 12 and the handle 142 of the lever 14 is rotated to a horizontal position, the cover 12 is pushed to move to a forward outermost position and the socket 1 is in a closed state, whereby the vertical aligning section 1631 of the retention member 163 abuts against a rear inner side of the slot 165. It should be noted that under this situation, the engagement area between the horizontal hook section 1632 of the retention member 163 and the supporting surface 1231 of the cover 12 is the same as the socket 1 is in the open state because the movement direction of vertical aligning section 1631 is vertical to an extension direction of the horizontal hook section 1632 from the vertical aligning section 1631. Therefore, a resisting force will not occur during the change of the socket 1 state, and the portion of the cover 12 around the cam shaft 141 thus would not be upwardly lifted from the base 10. Since the cover 12 has no chance to bear any vertical misplacement, the cover 12 will be smoothly moved to the forward outermost position by the cam shaft 141, and the pins of the CPU package can be correctly engaged with the corresponding contacts 20 positioned within the socket 1.

Figure 6:
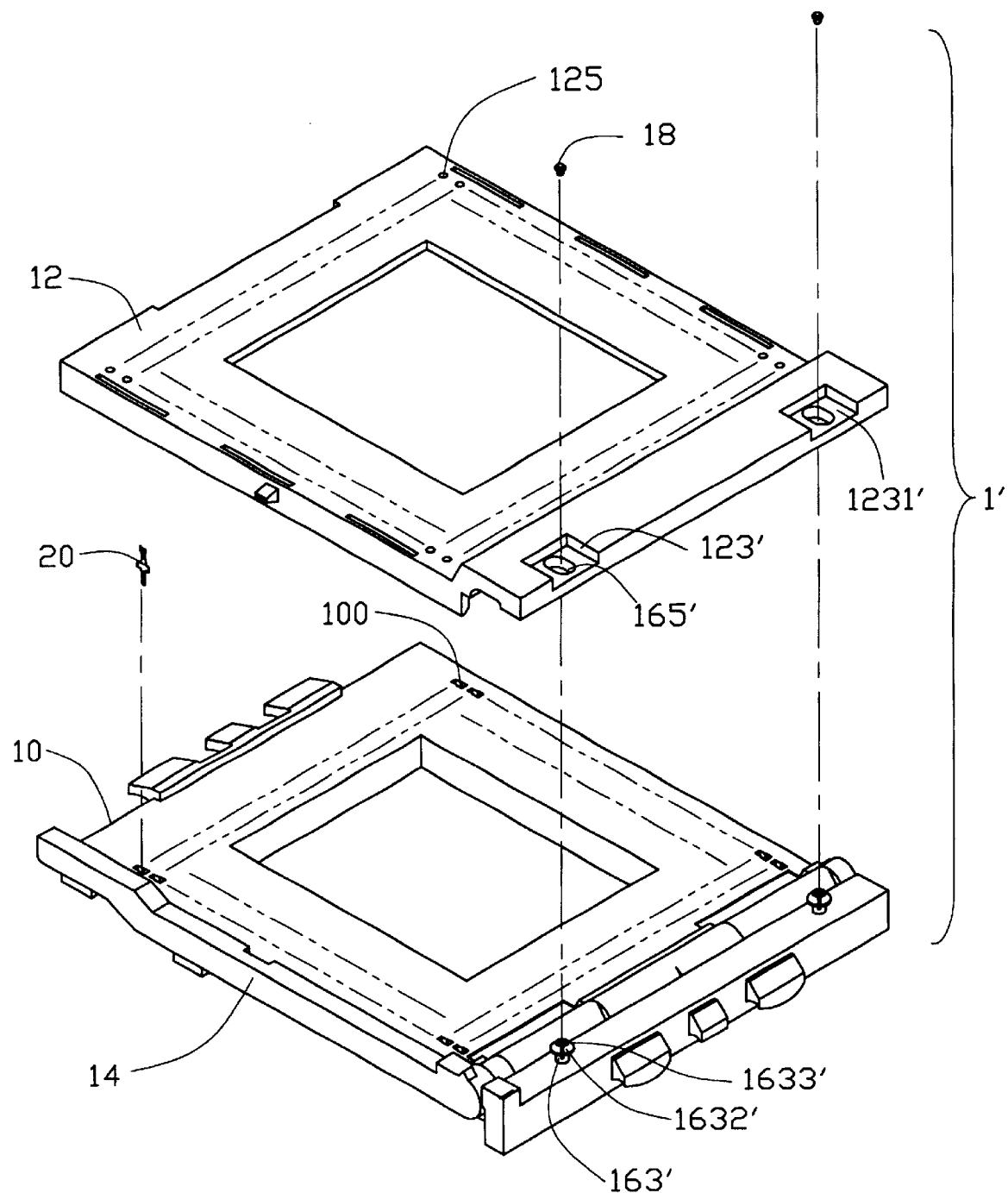
FIG. 6 is an exploded, perspective view of a ZIF socket in accordance with a second embodiment of the present invention.
Figure 7:
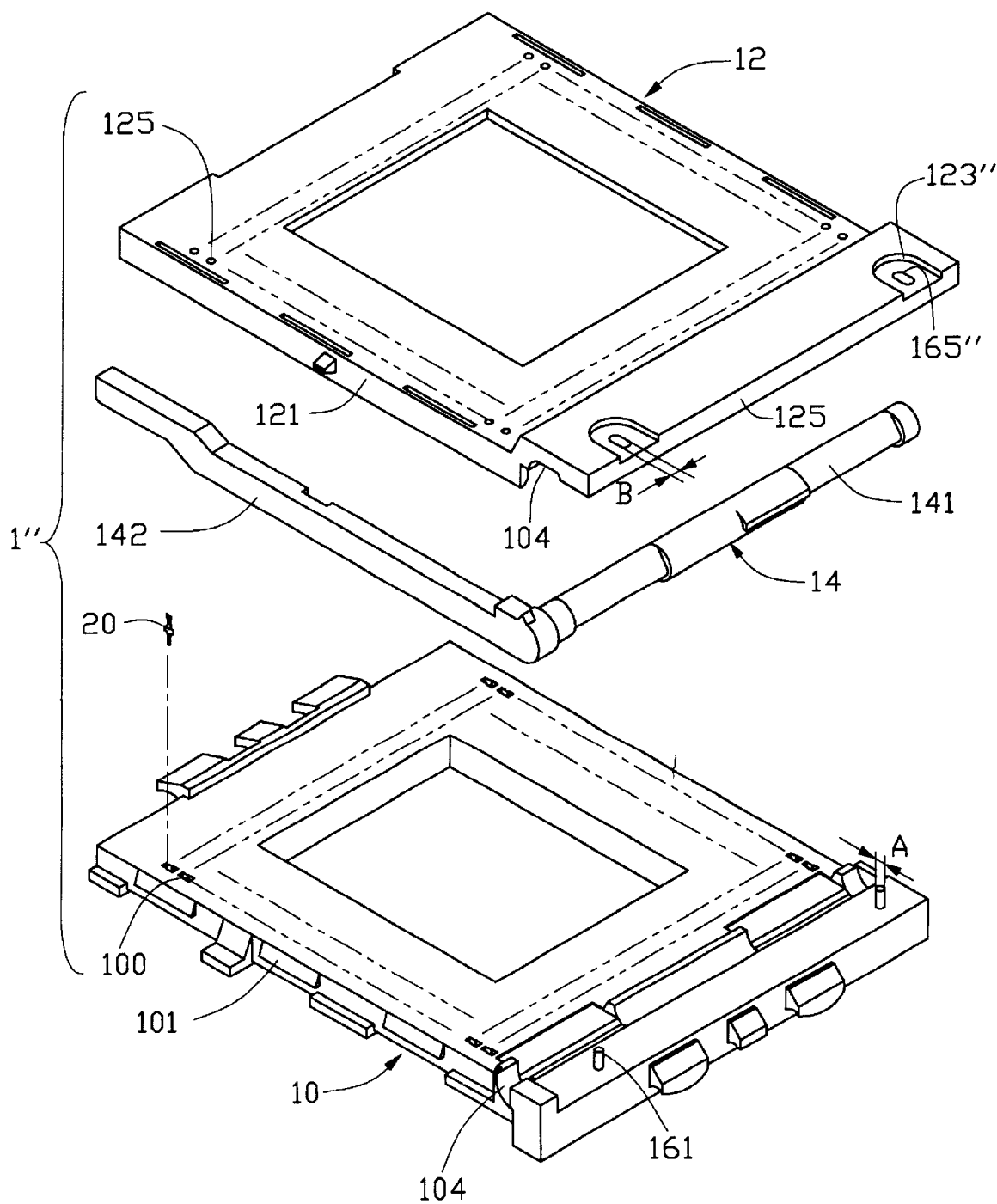
FIG. 7 is an exploded, perspective view of a ZIF socket in accordance with a third embodiment of the present invention.
Figure 8:
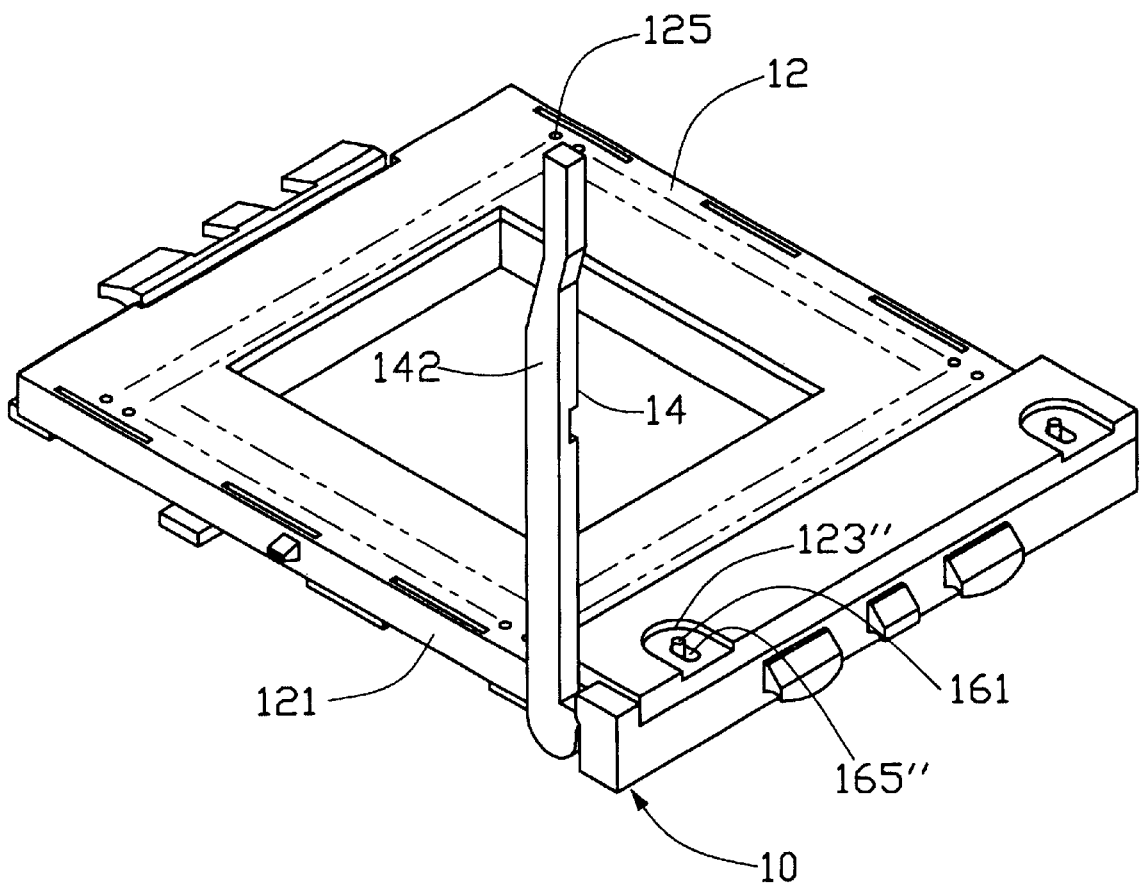
FIG. 8 is a perspective assembled view of the ZIF socket of FIG. 7 wherein the lever is in a vertical position.
Figure 9:
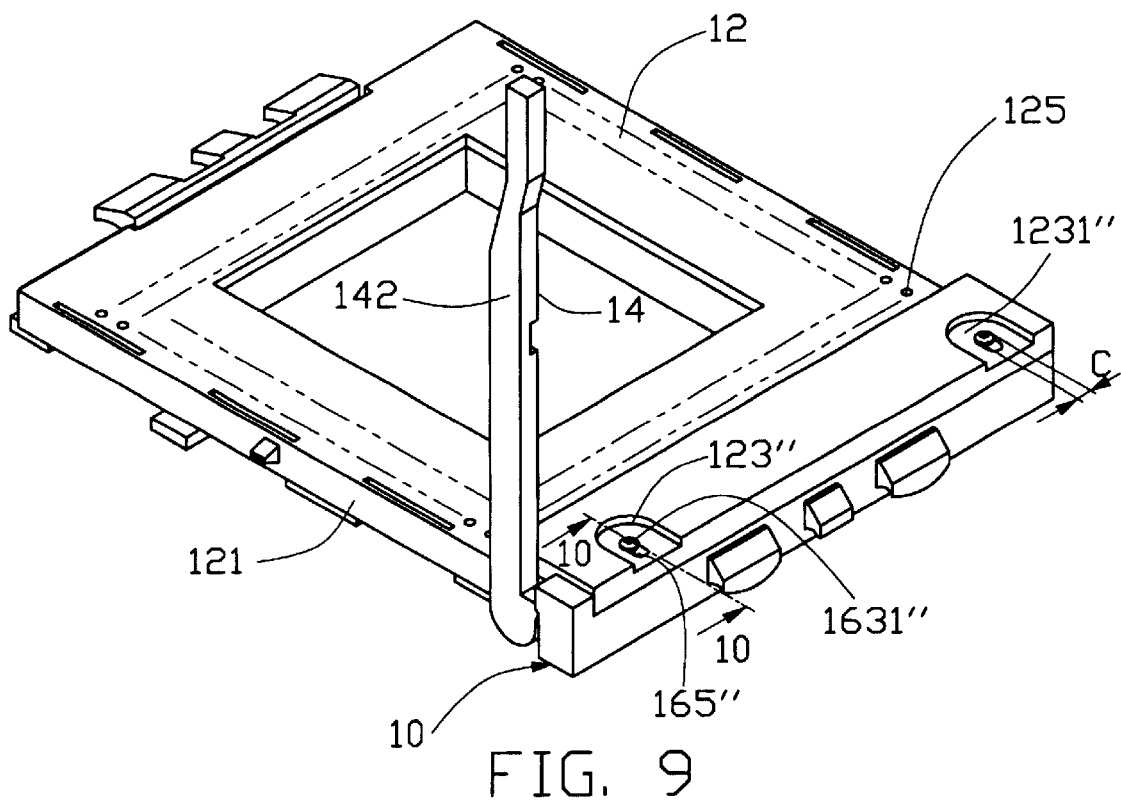
FIG. 9 is a view similar to FIG. 8, but with the retention mechanism being subject to the reworking process.
Figure 10:
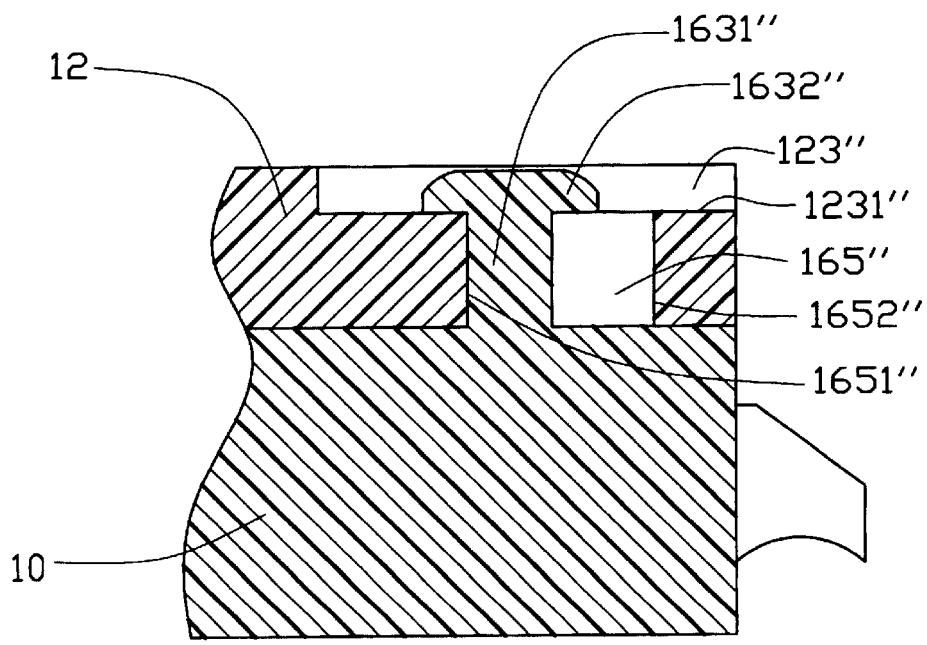
FIG. 10 is a partial, enlarged, cross-sectional view of the assembled ZIF socket taken along line 10—10 of FIG. 9.
Figure 11:
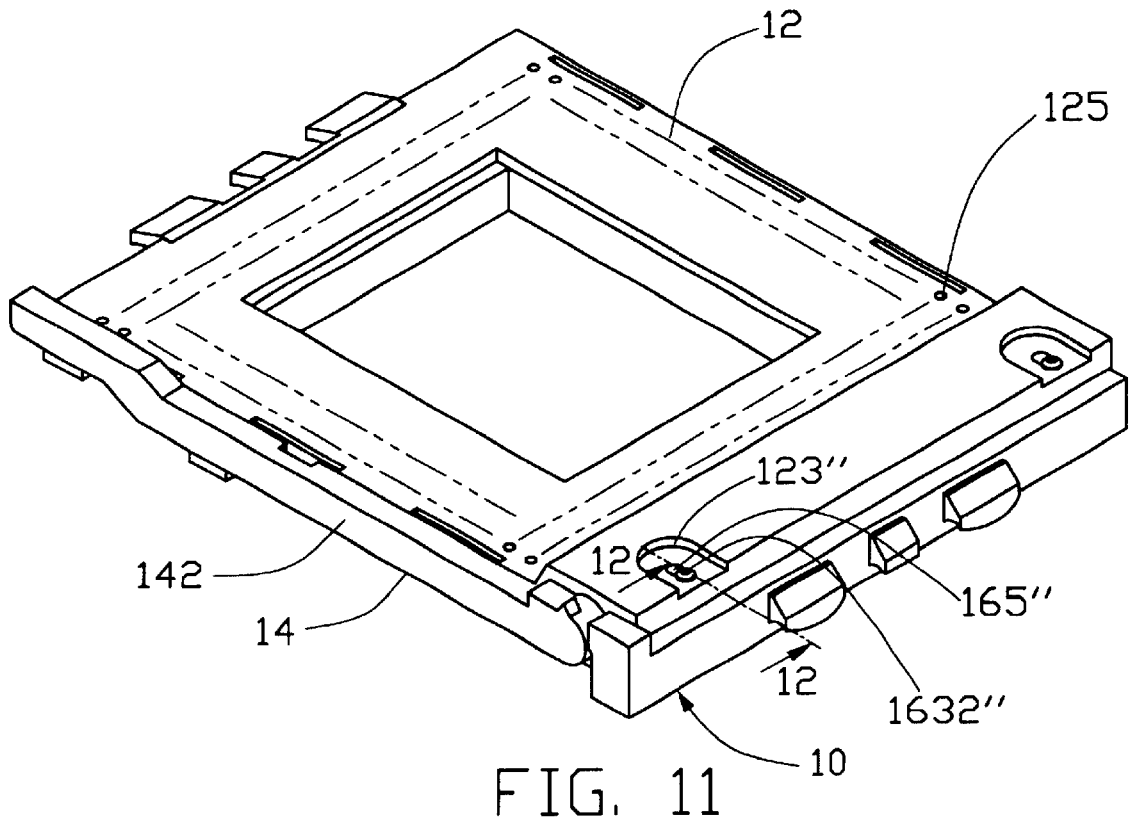
FIG. 11 is a perspective assembled view of the ZIF socket of FIG. 7 wherein the lever is in a horizontal position after the reworking process.
Figure 12:
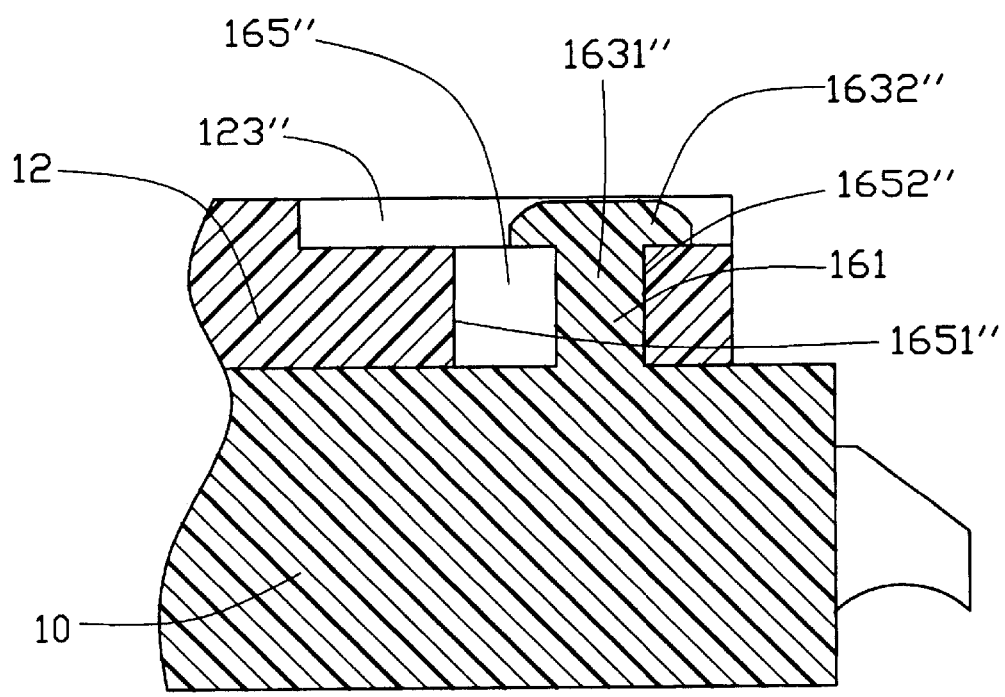
FIG. 12 is a partial, enlarged, cross-sectional view of the assembled ZIF socket taken along line 12—12 of FIG. 11.

FIG. 6 discloses a second embodiment of the present invention. The socket 1' has a retention member 163' similar to the retention member 163 in the first embodiment. The retention member 163' comprises a hook section 1632' defining a hole 1633' therein for receiving a pin 18. In assembly, the retention member 163' of the base 10 is movably inserted into an elliptic slot 165' of the cover 12. Then the pin 18 is inserted into the hole 1633' of the retention member 163', and the hook section 1632' of the retention member 163' engages with a supporting surface 1231' at the bottom of a cutout 123' communicated with the slot 165' in a rear portion of the cover 12. So the cover 12 engages with the base 10 firmly by the retention member 163' while the engagement area between the hook section 1632' and the supporting surface 1231' is the same in spite of the socket being in a closed state or in an open state.

FIGS. 7–12 disclose a socket 1" in accordance with a third embodiment of the present invention. In this embodiment, the retention member comprises a post 161 integrally extending from the rear portion of the base 10 and having a diameter of A. A pair of cutouts 123" is defined in a rear portion 125 of the cover 12. A slot 165" is in communication with the cutout 123" for receiving the post 161 and having a width of B, B being slightly larger than A. After an upper end of the post 161 is subject to a mechanics, heating or ultrasonic reworking process, a hook section 1632" is formed on the upper end of the post 161 and the remaining portion forms a vertical aligning section 1631". The hook section 1632" has a width of C, C being larger than B, so the hook section 1632" could abut against a supporting surface 1231" at the bottom of the cutout 123" and a reliable engagement between the base 10 and the cover 12 is achieved. The vertical aligning section 1631" of the retention member 163" is moveably received between a front inner side 1651" and a rear inner side 1652" of the slot 165", as is clearly shown in FIGS. 10 and 12.

Figure 13:
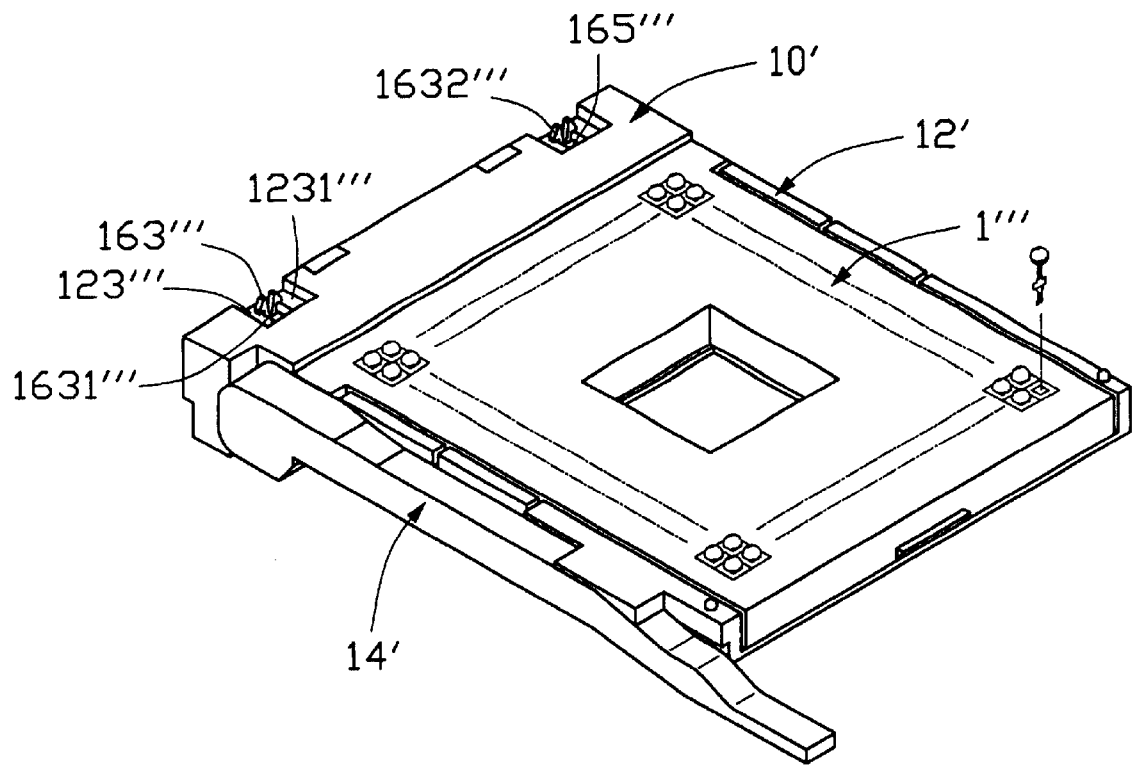
FIG. 13 is a perspective, assembled view of a BGA ZIF socket in accordance with a fourth embodiment of the present invention.
Figure 14:
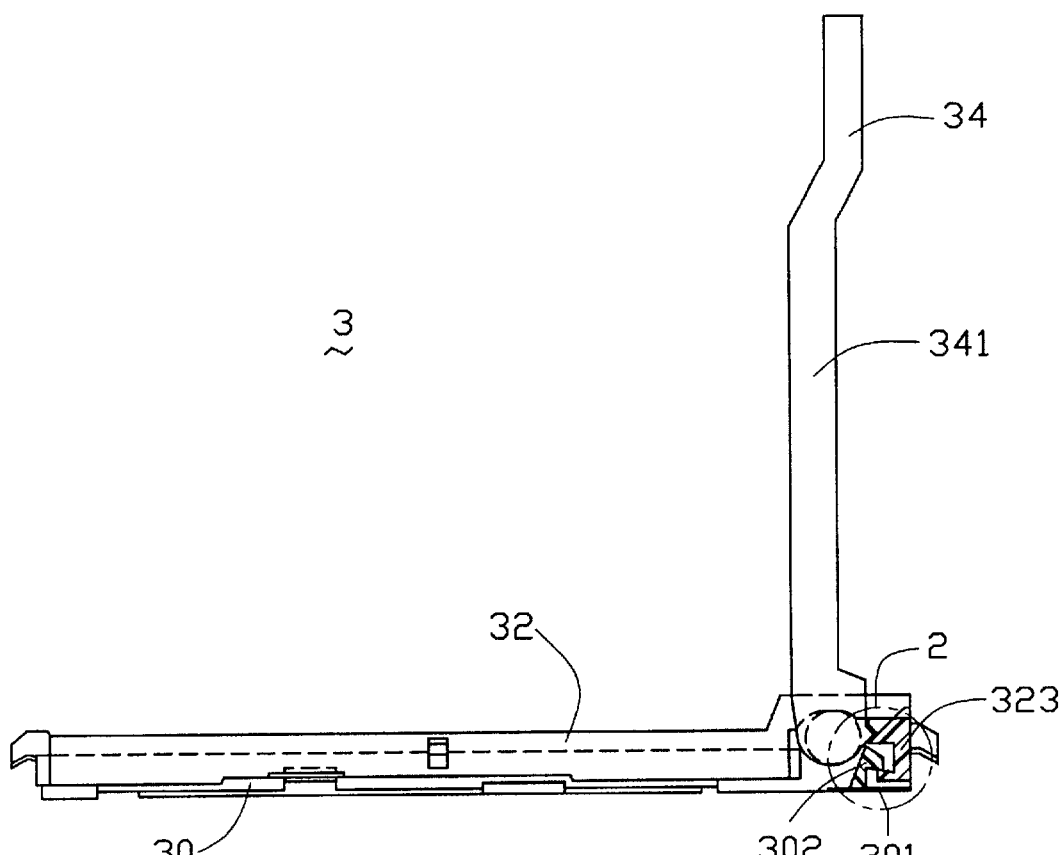
FIG. 14 is a partially cross-sectional side view of an assembled conventional ZIF socket wherein the lever is in a vertical position and the socket is in an open state.
Figure 15:
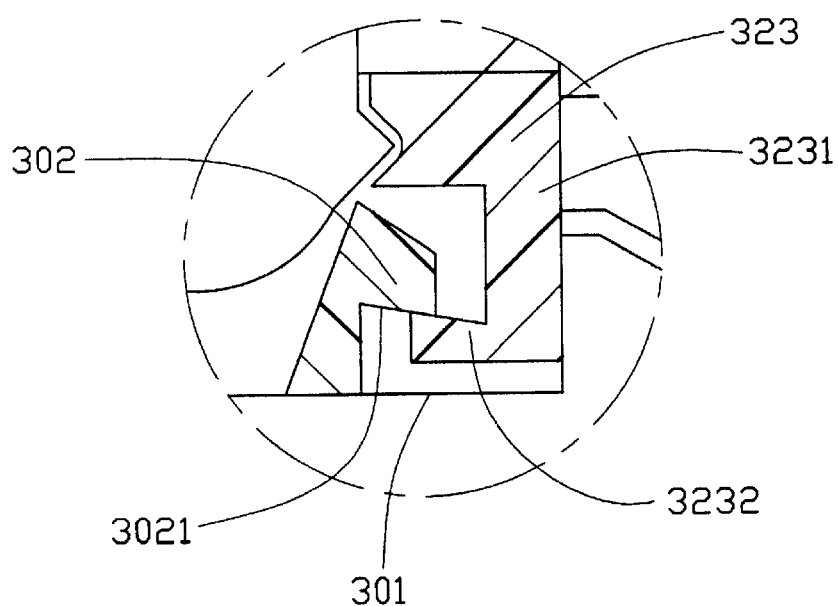
FIG. 15 is a partial, enlarged, cross-sectional view of the conventional ZIF socket of FIG. 14.

FIG. 13 discloses a ball grid gray (BGA) socket 1'" in accordance with a fourth embodiment of the present invention. The socket 1'" comprises a base 10', a cover 12' movably mounted on the base 10', and a lever 14' assembled between the base 10' and the cover 12' for actuating the cover 12' to move along the base 10'. A retention member 123'" integrates from the cover 12'. A vertical aligning section 1631'" of the retention member 123'" can be movably received a slot 165'" in the base 10' and a horizontal hook section 1632'" of the retention member 123'" abuts against a supporting surface 1231'" at the bottom of a cutout 123'" in the base 10', thus assuring that the retention member 163'" of the cover 12' is always disposed in the cutout 123'" of the base 10' without any possibility of withdrawal therefrom by any inadvertent external impact. When the BGA socket 1'" moves from an open state to a closed state or vice versa, the engaging performance of the retention member 123'" is unchanged.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, persons of ordinary skill in this field are to understand that all such equivalent structures are to be included within the scope of the following claims.

What is claimed is:

1. An electrical socket comprising:
    a base having a plurality of passageways extending vertically therethrough;
    a corresponding number of contacts received within the passageways, respectively;
    a cover movably mounted on the base and defining a plurality of holes extending therethrough in alignment with the passageways, respectively;
    a lever assembled between the base and the cover for driving the cover to move along the base;
    a retention mechanism including a plurality of retention members monolithically formed on one of said cover and said base, a plurality of supporting surfaces formed on the other of said cover and said base, and a slot defined in each of the supporting surfaces, each retention member including a vertical aligning section movably received within said slot and a horizontal hook section formed on the vertical aligning section for engagement with the supporting surface.

2. The electrical socket as described in claim 1, wherein each retention member defines a hole for receiving a pin therein.

3. The electrical socket as described in claim 1, wherein the vertical aligning section of each retention member is movably received in the slot between opposite front and rear inner sides thereof.

4. The electrical socket as described in claim 1, further comprising a cutout communicating with the slot, and wherein one of said plurality of supporting surfaces is formed at the bottom of the cutout.

5. The electrical socket as described in claim 1, wherein the horizontal hook section of each retention member is subject to a heating process after the vertical aligning section is received in the slot.

6. The electrical socket as described in claim 5, wherein a width of the horizontal hook section is larger than a width of the slot, the width of the slot being slightly larger than a width of the vertical aligning section.

* * * * *